(12) United States Patent
Kutsuki et al.

(10) Patent No.: US 10,693,377 B2
(45) Date of Patent: Jun. 23, 2020

(54) CONVERTER DEVICE

(71) Applicant: Mitsubishi Electric Corporation, Tokyo (JP)

(72) Inventors: Tomohiro Kutsuki, Tokyo (JP); Akira Sakai, Tokyo (JP); Daisuke Suzuki, Tokyo (JP); Satoru Ichiki, Tokyo (JP); Akito Tanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 126 days.

(21) Appl. No.: 15/780,287

(22) PCT Filed: Feb. 24, 2016

(86) PCT No.: PCT/JP2016/055504
§ 371 (c)(1),
(2) Date: May 31, 2018

(87) PCT Pub. No.: WO2017/145303
PCT Pub. Date: Aug. 31, 2017

(65) Prior Publication Data
US 2019/0173384 A1    Jun. 6, 2019

(51) Int. Cl.
*H02M 3/158* (2006.01)
*H02M 1/32* (2007.01)
(Continued)

(52) U.S. Cl.
CPC ........ *H02M 3/1584* (2013.01); *G01R 31/282* (2013.01); *G01R 31/327* (2013.01);
(Continued)

(58) Field of Classification Search
None
See application file for complete search history.

(56) References Cited

U.S. PATENT DOCUMENTS 8,248,040 B2 *   8/2012   Rausch .............. H02M 1/4225
                                                    323/207
8,912,775 B2 *  12/2014   Feldtkeller ......... H02M 1/4225
                                                    323/207
(Continued)

FOREIGN PATENT DOCUMENTS

CN         101388602 A      3/2009
CN         103378743 A     10/2013
(Continued)

OTHER PUBLICATIONS

Extended European Search Report dated Feb. 13, 2019 issued in corresponding EP patent application No. 16891460.4.
(Continued)

*Primary Examiner* — Jue Zhang
*Assistant Examiner* — Henry E Lee, III
(74) *Attorney, Agent, or Firm* — Posz Law Group, PLC (57) ABSTRACT

The converter device includes a rectification circuit that receives, as an input, AC power from an AC power supply, and performs full-wave rectification on the AC power received, a booster circuit that boosts an output voltage from the rectification circuit, a smoothing capacitor that smooths an output voltage from the booster circuit, and outputs a voltage smoothed, to the load, and a controller that controls the booster circuit. The booster circuit includes a plurality of booster sections each of which includes a reactor, a switching element, and a reverse-blocking diode. The controller maintains, in an ON state, the switching element included in at least one of the plurality of booster sections for a predetermined time period to determine the presence or absence of a fault of the booster section.

28 Claims, 5 Drawing Sheets

(51) Int. Cl.
  *H02M 1/42* (2007.01)
  *G01R 31/40* (2020.01)
  *G01R 31/28* (2006.01)
  *G01R 31/327* (2006.01)
  *G01R 31/72* (2020.01)

(52) U.S. Cl.
  CPC .............. *G01R 31/40* (2013.01); *H02M 1/32* (2013.01); *H02M 1/4225* (2013.01); *G01R 31/3278* (2013.01); *G01R 31/72* (2020.01); *H02M 2001/322* (2013.01); *H02M 2001/325* (2013.01)

(56) References Cited

U.S. PATENT DOCUMENTS

| | | | |
|---|---|---|---|
| 9,263,968 B2* | 2/2016 | Potts | H02M 3/33584 |
| 9,577,513 B2* | 2/2017 | Feldtkeller | H02M 1/4225 |
| 9,800,148 B2* | 10/2017 | Gritti | H02M 3/157 |
| 9,991,788 B2* | 6/2018 | Oe | H02M 1/42 |
| 2009/0027925 A1 | 1/2009 | Kanouda et al. | |
| 2010/0110593 A1 | 5/2010 | Kim et al. | |
| 2010/0202169 A1 | 8/2010 | Gaboury et al. | |
| 2013/0342139 A1 | 12/2013 | Shimomugi et al. | |
| 2014/0225553 A1 | 8/2014 | Otorii et al. | |

FOREIGN PATENT DOCUMENTS

| | | |
|---|---|---|
| CN | 103477545 A | 12/2013 |
| CN | 104868716 A | 8/2015 |
| JP | 2007-195282 A | 8/2007 |
| JP | 2009-232545 A | 10/2009 |
| JP | 2014-128183 A | 7/2014 |
| JP | 2014-212588 A | 11/2014 |
| JP | 2015-128352 A | 7/2015 |

OTHER PUBLICATIONS

Serkan Dusmez. "An Active Life Extension Strategy for Thermally Aged Power Switches Based on the Pulse-Width Adjustment Method in Interleaved Converters." IEEE Transactions on Power Electronics, vol. 31, No. 7, Oct. 5, 2015, p. 5149-5160.

NCP1631—"Interleaved, 2-Phase Power Factor Controller" Aug. 2009, p. 1-24.

Mahmoud Shahbazi. "Open- and Short-Circuit Switch Fault Diagnosis for Nonisolated DC DC Converters Using Field Programmable Gate Array." IEEE Transactions on Industrial Electronics, vol. 60, No. 9, Sep. 1, 2013, p. 4136-4146.

Office Action dated Jun. 18, 2019 issued in corresponding CA patent application No. 3,015,049.

Office Action dated Nov. 1, 2019 issued in corresponding CN patent application No. 201680079235.1 (and English translation).

Office Action dated Feb. 21, 2019 issued in corresponding AU patent application No. 2016394625.

Eunice Ribeiro et al., "Open-Circuit Fault Diagnosis in Interleaved DC-DC Converters" IEEE Transactions on Power Electronics, vol. 29, No. 6, Jun. 2014 pp. 3091-3102.

International Search Report of the International Searching Authority dated May 10, 2016 for the corresponding international application No. PCT/JP2016/055504 (and English translation).

* cited by examiner

CONVERTER DEVICE

CROSS REFERENCE TO RELATED APPLICATION

This application is a U.S. national stage application of International Patent Application No. PCT/JP2016/055504 filed on Feb. 24, 2016, the disclosure of which is incorporated herein by reference.

TECHNICAL FIELD

The present invention relates to a converter device including an interleaved power factor regulation circuit to convert alternating current (AC) power into direct current (DC) power, and to a technology for detecting a fault of the power factor regulation circuit.

BACKGROUND

Conventionally, to improve the power factor of an input current and to boost an output voltage, it has been proposed that a converter device that converts AC power into DC power use a booster circuit (so-called a power factor regulation circuit) consisting of a reactor, a reverse-blocking diode, and a switching element. Patent Literature 1 proposes a so-called interleaved power factor regulation circuit as an application of such power factor regulation circuit. That is, the power factor regulation circuit disclosed in Patent Literature 1 is a circuit that includes multiple booster sections coupled in parallel with one another, each consisting of a reactor, a reverse-blocking diode, and a switching element to allow the current path to branch, and that provides control to sequentially switch the switching elements of the respective booster sections, thereby enabling harmonic current to be reduced or eliminated.

PATENT LITERATURE

Patent Literature 1: Japanese Patent Application Laid-open No. 2007-195282

When the conventional interleaved power factor regulation circuit described in Patent Literature 1 employs a one-shunt technique in which the control is provided by detecting only the bus current as current information, each shunt current cannot be individually detected, but the amount of the bus current, i.e., the total current, can only be determined. Accordingly, even when the parallel-coupled booster sections include a non-conducting booster section due to a cause such as disconnection of a connection terminal of the reactor or an open fault of the switching element, such booster section cannot be identified. In addition, the presence of a non-conducting booster section increases the current flowing to the other booster section(s) compared to the originally expected current, thereby possibly causing an overheat fault of a switching element and of a diode during a high load operation.

SUMMARY

The present invention has been made in view of the foregoing, and it is an object of the present invention to provide a converter device capable of preventing thermal breakdown of a circuit element.

A converter device according to an aspect of the present invention is provided for converting alternating current power supplied from an alternating current power supply into direct current power, and outputting the direct current power to a load. The converter device includes: a rectification circuit to receive the alternating current power from the alternating current power supply as an input, and to perform full-wave rectification on the alternating current power received; a booster circuit to boost an output voltage from the rectification circuit; a smoothing capacitor to smooth an output voltage from the booster circuit, and to output the voltage smoothed, to the load; and a controller to control the booster circuit. The booster circuit includes a plurality of booster sections each of which includes a reactor, a switching element, and a reverse-blocking diode, and the controller maintains, in an "on" state, the switching element included in at least one of the plurality of booster sections for a predetermined time period to determine presence or absence of a fault of the at least one of the booster sections.

A converter device according to the present invention is advantageous in being capable of preventing thermal breakdown of a circuit element.

DETAILED DESCRIPTION

A converter device according to embodiments of the present invention will be described below in detail with reference to the drawings. Note that these embodiments are not intended to limit this invention.

First Embodiment

Figure 1:
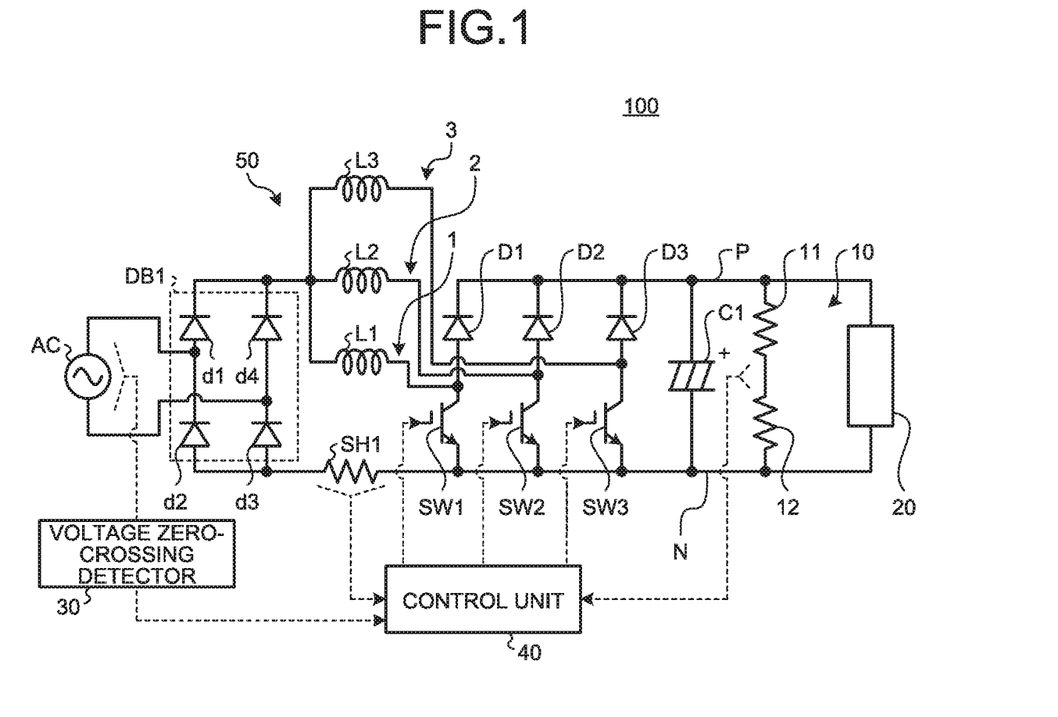
FIG. 1 is a configuration diagram of a converter device according to a first embodiment of the present invention.

FIG. 1 is a configuration diagram of a converter device according to a first embodiment of the present invention. A converter device 100 according to the first embodiment includes an interleaved power factor regulation circuit. The power factor regulation circuit is a circuit that includes multiple booster sections each including a set of a reactor, a switching element, and a reverse-blocking diode, and provides control to sequentially switch the switching elements of the respective booster sections, thereby enabling harmonic current to be reduced or eliminated. Although FIG. 1 illustrates, by way of example, a three-stage interleave circuit including three booster sections 1, 2, and 3 coupled in parallel with one another, the interleave circuit applied to the converter device 100 is not limited to a three-stage interleave circuit, but may be an interleave circuit having two or more stages.

The converter device 100 illustrated in FIG. 1 includes a diode bridge DB1, which is a rectification circuit that receives, as an input, AC power from a single-phase AC power supply AC, and performs full-wave rectification on the AC power received; a booster circuit 50 that boosts the output voltage from the diode bridge DB1; a smoothing capacitor C1 that smooths the output voltage from the booster circuit 50, and outputs the smoothed voltage to a load 20; a bus voltage detection circuit 10; a bus current detector SH1; a voltage zero-crossing detector 30; and a control unit 40 that controls the booster circuit 50. An example of the load 20 is an air conditioner.

Although the diode bridge DB1 illustrated in FIG. 1 is a full-wave rectification circuit formed by a combination of four diodes d1, d2, d3, and d4, the configuration of the diode bridge DB1 is not limited thereto, and the diode bridge DB1 may be configured by a combination of metal oxide semiconductor field effect transistors (MOSFETs).

The booster circuit 50 includes a booster section 1 including a reactor L1, a switching element SW1, and a reverse-blocking diode D1; a booster section 2 including a reactor L2, a switching element SW2, and a reverse-blocking diode D2; and a booster section 3 including a reactor L3, a switching element SW3, and a reverse-blocking diode D3.

The AC power supply AC is connected to the diode bridge DB1, and the positive end of the diode bridge DB1 is connected to one end of the reactor L1. The other end of the reactor L1 is connected to a connection terminal between the switching element SW1 and the anode side of the reverse-blocking diode D1. The cathode side end of the reverse-blocking diode D1 is connected to the positive end of the smoothing capacitor C1. The reactor L1, the switching element SW1, and the reverse-blocking diode D1 connected as above configure the booster section 1.

The positive side of the diode bridge DB1 is also connected to one end of the reactor L2. The other end of the reactor L2 is connected to a connection terminal between the switching element SW2 and the anode side of the reverse-blocking diode D2. The cathode side end of the reverse-blocking diode D2 is connected to the positive end of the smoothing capacitor C1. The reactor L2, the switching element SW2, and the reverse-blocking diode D2 connected as above configure the booster section 2.

The positive side of the diode bridge DB1 is also connected to one end of the reactor L3. The other end of the reactor L3 is connected to a connection terminal between the switching element SW3 and the anode side of the reverse-blocking diode D3. The cathode side end of the reverse-blocking diode D3 is connected to the positive end of the smoothing capacitor C1. The reactor L3, the switching element SW3, and the reverse-blocking diode D3 connected as above configure the booster section 3.

The end portions of the three switching elements SW1, SW2, and SW3 other than the end portions respectively connected to the reactors L1, L2, and L3 are connected to the negative end of the smoothing capacitor C1 and to one end of the bus current detector SH1. The other end of the bus current detector SH1 is connected to the negative end of the diode bridge DB1.

The positive end of the smoothing capacitor C1 is connected to a positive-side DC bus P, and the negative end of the smoothing capacitor C1 is connected to a negative-side DC bus N. Both ends of the smoothing capacitor C1 are connected to the load 20.

The bus voltage detection circuit 10 includes a voltage divider resistor 11 and a voltage divider resistor 12. One end of the serial circuit constituted by the voltage divider resistor 11 and the voltage divider resistor 12 is connected to the positive-side DC bus P, and the other end of the serial circuit is connected to the negative-side DC bus N. The combination of the voltage divider resistors 11 and 12 divides and limits the charged voltage the smoothing capacitor C1 within a voltage range detectable by the control unit 40.

The voltage zero-crossing detector 30, which is a phase detection section, detects the zero-crossing point of the AC power from the AC power supply AC, and outputs information on the zero-crossing point detected, to the control unit 40. The bus current detector SH1 detects a bus current flowing between the diode bridge DB1 and the load 20, and outputs information on the bus current detected, to the control unit 40.

The control unit 40 outputs a pulse width modulation (PWM) signal for driving the switching elements SW1, SW2, and SW3 based on pieces of the information output from the voltage zero-crossing detector 30, from the bus current detector SH1, and from the bus voltage detection circuit 10 to provide ON and OFF control. This operation provides power factor regulation control. Note that the control unit 40 may receive information other than the information described above, and the operation of the power factor regulation control may use such other information.

The control unit 40 according to the present embodiment performs fault detection on each of the booster sections 1, 2, and 3 before the beginning of power factor regulation control and when the load of the load 20 is very low. It is assumed that before any of the switching elements SW1, SW2, and SW3 is turned on, the load of the load 20 is very low, and therefore, substantially no bus current is flowing. In addition, a fault detection operation on any one of the booster sections 1, 2, and 3 may hereinafter referred to simply as "fault detection."

An operation of fault detection in the control unit 40 will next be described in detail referring to FIGS. 2 and 3.

Figure 2:
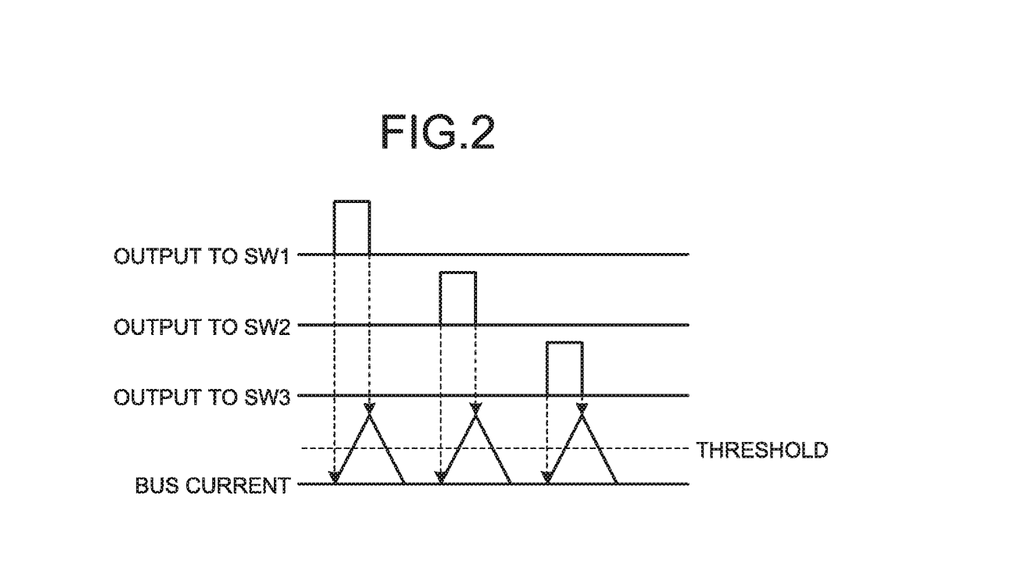
FIG. 2 is a first chart for explaining an operation for fault detection in the converter device according to the first embodiment of the present invention.

FIG. 2 is a first chart for explaining an operation for fault detection in the converter device according to the first embodiment of the present invention. FIG. 2 illustrates waveforms of the PWM signals for driving the corresponding switching elements SW1, SW2, and SW3. In FIG. 2, the PWM signals for providing ON and OFF control of the switching elements SW1, SW2, and SW3 are respectively denoted by an output to SW1, an output to SW2, and an output to SW3. FIG. 2 also illustrates a waveform of the bus current detected when the output of PWM signal to SW1 is provided, a waveform of the bus current detected when the output of PWM signal to SW2 is provided, and a waveform of the bus current detected when the output of PWM signal to SW3 is provided. FIG. 2 further illustrates, using a dotted line, a fault determination threshold for determining the presence or absence of a fault in each of the booster sections 1, 2, and 3.

In the fault detection operation, the control unit 40 first maintains the switching element SW1 in an ON state for a certain time period. Turning on the switching element SW1 establishes a current path including the AC power supply AC, the diode bridge DB1, the reactor L1, the switching element SW1, the bus current detector SH1, the diode bridge DB1, and the AC power supply AC illustrated in FIG. 1, thereby causing a bus current to start flowing.

Next, when the switching element SW1 is turned off after the predetermined time period, the bus current immediately before the turning off is detected by the bus current detector SH1. The current detected at this time point is the current that has flowed to the booster section 1 along the current path described above. Due to a high inductance of the reactor L1 in the current path, the magnitude of the current generated by turning on the switching element SW1 will not immediately decrease to zero after the switching element SW1 is turned off. Thus, the switching element SW1 is turned off and the off state is maintained until the bus current attenuates to a very low value. Then, the switching element SW2 is turned on, and current detection is performed similarly to the case of the switching element SW1 to detect the current that has flowed to the booster section 2. Then, after a certain time period is allowed to elapse to cause the bus current to attenuate to a very low value, the switching element SW3 is turned on to detect the current that has flowed to the booster section 3, similarly.

When the magnitude of the bus current that has flowed to one of the booster sections 1, 2, and 3 is greater than or equal to the fault determination threshold, it is determined that the one booster section is in a normal condition. When all of the booster sections 1, 2, and 3 are in a normal condition, it is determined that the control unit 40 is in a normal condition.

Figure 3:
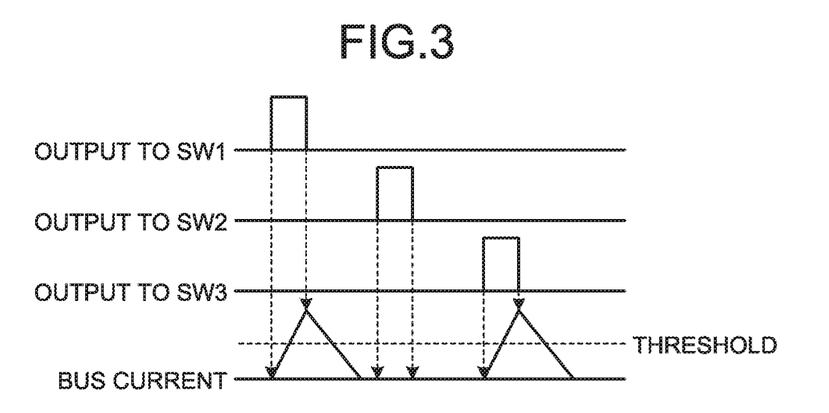
FIG. 3 is a second chart for explaining an operation for fault detection in the converter device according to the first embodiment of the present invention.

FIG. 3 is a second chart for explaining an operation for fault detection in the converter device according to the first embodiment of the present invention. FIG. 3 illustrates, similarly to FIG. 2, waveforms of the outputs of PWM signal to SW1, SW2, and SW3, and a waveform of the bus current detected when outputs of PWM signal to SW1, SW2, and SW3 are provided. FIG. 3 differs from FIG. 2 in that an anomaly in the booster section 2 causes the value of the bus current to be less than the threshold even when the switching element SW2 is turned on. As described above, having detected a bus current less than the threshold level, the control unit 40 determines that the booster section 2 has a fault.

Although FIGS. 2 and 3 illustrate the number of switching operations for determining the presence or absence of a fault as one for each of the booster sections 1, 2, and 3, such number may be two or more. That is, a determination of the presence or absence of a fault may be made by outputting a PWM signal multiple times to each of the switching elements SW1, SW2, and SW3 to switch each of the switching elements SW1, SW2, and SW3 multiple times. When each of the switching elements SW1, SW2, and SW3 is switched multiple times, the determination method may follow, for example, a so-called majority rule to determine that the device is in a normal condition when the value of [the number of times the threshold is reached or exceeded]/[the number of switching operations] is greater than ½. Moreover, although FIGS. 2 and 3 illustrate that the switching element SW1, switching element SW2, and the switching element SW3 are sequentially switched in this order, the switching elements SW1, SW2, and SW3 may be switched in any order.

When the control unit 40 determines that all of the booster sections 1, 2, and 3 are in a normal condition, the control unit 40 then begins to perform power factor regulation control, and permits the load of the load 20 to increase. When at least one of the booster sections 1, 2, and 3 is in an abnormal condition, the control unit 40 determines that the booster circuit 50 is in an abnormal condition. Consequently, the control unit 40 does not permit the power factor regulation control and an increase in the load of the load 20. Alternatively, the control unit 40 may be configured to, when one of the booster sections 1, 2, and 3 has a fault, reduce the rated current of the load 20 to ⅔, and permit an increase in the load of the load 20 and the power factor regulation control within that limit. The control unit 40 may further be configured to, when two of the booster sections 1, 2, and 3 have a fault, permit an increase in the load of the load 20 and the power factor regulation control within ⅓ of the rated current of the load 20, and permit the operation to continue. The control unit 40 may further be configured to, when all of the booster sections 1, 2, and 3 have a fault, recognize an abnormal condition, and inhibit power factor regulation control and an increase in the load of the load 20. Any of these operations can prevent a current higher than a predicted level from flowing to a circuit element, and can thus prevent an overheat fault from occurring.

Second Embodiment

A second embodiment describes an example configuration of the converter device 100 that uses a supply voltage phase in the fault detection control. The converter device 100 of the second embodiment uses a circuit similar to the configuration of the converter device 100 illustrated in FIG. 1. The first embodiment and the second embodiment differ from each other in the method of fault detection in the control unit 40.

An advantage of the use of the supply voltage phase in the fault detection control will first be described. The magnitude of the current caused to flow by turning on a switching element during a fault detection operation depends on the amplitude of the supply voltage, on the phase of the supply voltage at the time when that switching element is turned on, on the inductance of the corresponding reactor, and on the duration of the ON state of that switching element. In this regard, the amplitude of the supply voltage and the inductance of the corresponding reactor are constant values, and the duration of the ON state is also a predetermined value. However, the phase of the supply voltage is undetermined in the method of the first embodiment.

Figure 4:
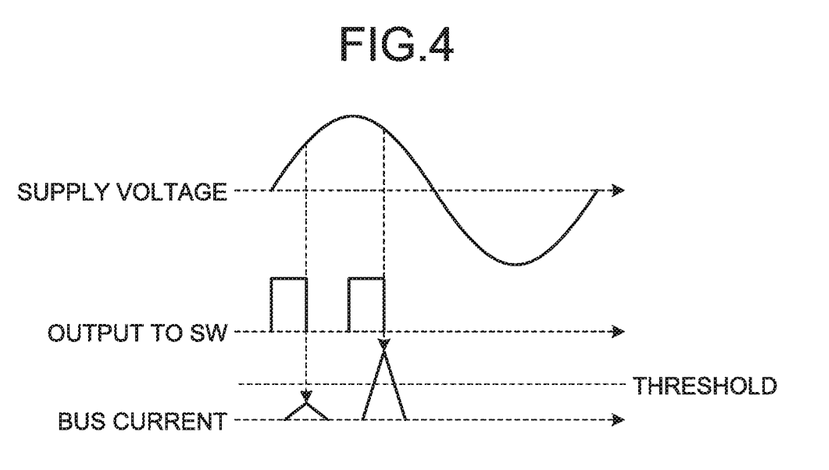
FIG. 4 is a chart for explaining an advantage of utilizing the supply voltage phase in fault detection control in the converter device according to a second embodiment of the present invention.

Here, FIG. 4 is a chart for explaining an advantage of utilizing the supply voltage phase in the fault detection control in the converter device according to the second embodiment of the present invention. FIG. 4 illustrates the amplitude of the supply voltage, an output to SW, and the bus current. As illustrated in FIG. 4, even for the same amplitude of the supply voltage, the same inductance of the corresponding reactor, and the same duration of the ON state (hereinafter referred to as ON duration), turning on a switching element when the supply voltage phase is near 0 or 180 degrees results in a slow increase in the bus current due to a low supply voltage, and hence in a low current flow, while turning on a switching element when the supply voltage phase is near 90 or 270 degrees results in a rapid increase in the current due to a high supply voltage, and hence in a high current flow. Thus, in the first embodiment, turning on a switching element when the supply voltage phase is near 0 or 180 degrees needs a long ON duration to allow a bus current significantly higher than the threshold to flow, while turning on a switching element when the supply voltage phase is near 90 or 270 degrees requires an appropriately short ON duration to prevent breakdown of an element due to a significantly high current. Accordingly, determination of a suitable combination of the threshold and the ON duration is not a straightforward matter. Thus, when the supply voltage phase is detected and the supply voltage phase at which a switching element is to be turned on is specified, the magnitude of the bus current that will flow can be previously predicted, thereby determination of a suitable combination of the threshold and the ON duration is facilitated.

Figure 5:
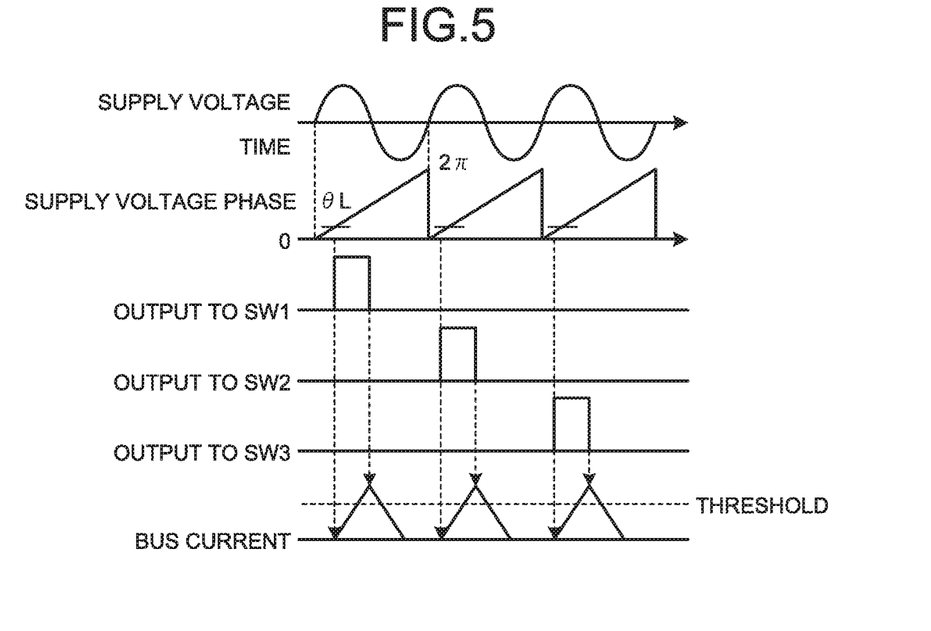
FIG. 5 is a chart for explaining a fault detection operation utilizing the supply voltage phase in the converter device according to the second embodiment of the present invention.

FIG. 5 is a chart for explaining a fault detection operation utilizing the supply voltage phase in the converter device according to the second embodiment of the present invention. FIG. 5 illustrates the supply voltage, the supply voltage phase, the outputs of PWM signal to SW1, SW2, and SW3, and a waveform of the bus current detected when the outputs of PWM signal to SW1, SW2, and SW3 are provided. The voltage zero-crossing detector 30 detects the time points when the supply voltage phase is 0 degree and 360 degrees. Thus, the control unit 40 operates to restart the timer in the control unit 40 at the time point when the zero-crossing signal output from the voltage zero-crossing detector 30 is received, and measures the input interval of the zero-crossing signal using that timer. This operation enables the control unit 40 to calculate the current supply voltage phase (in degree) by [current count value of timer]/[timer value for the interval of zero-crossing signal]×360. In the fault detection operation, the supply voltage phase is determined using this technique; a switching element is turned on at the time point when the supply voltage phase reaches a certain value; and the magnitude of the current is detected in the OFF state after a predetermined time period elapses. The control unit 40 performs this operation on each of the three booster sections 1, 2, and 3. This operation is capable of eliminating the risk of causing an excessively high current to flow during the fault detection operation, and moreover, is capable of eliminating the possibility that a current less than the threshold level flows even in a normal phase, and thus a fault becomes undetectable.

Note that, instead of the method in which the supply voltage phase is determined and a switching element is turned on at a particular supply voltage phase, another method may be used in which the converter device 100 includes a supply voltage detector (not illustrated) that detects an instantaneous value of the supply voltage, and the control unit 40 turns on a switching element when the instantaneous value of the supply voltage detected by the supply voltage detector reaches a certain value. Such configuration is also capable of providing an advantage equivalent or similar to an advantage provided by the use of the supply voltage phase.

Third Embodiment

Figure 6:
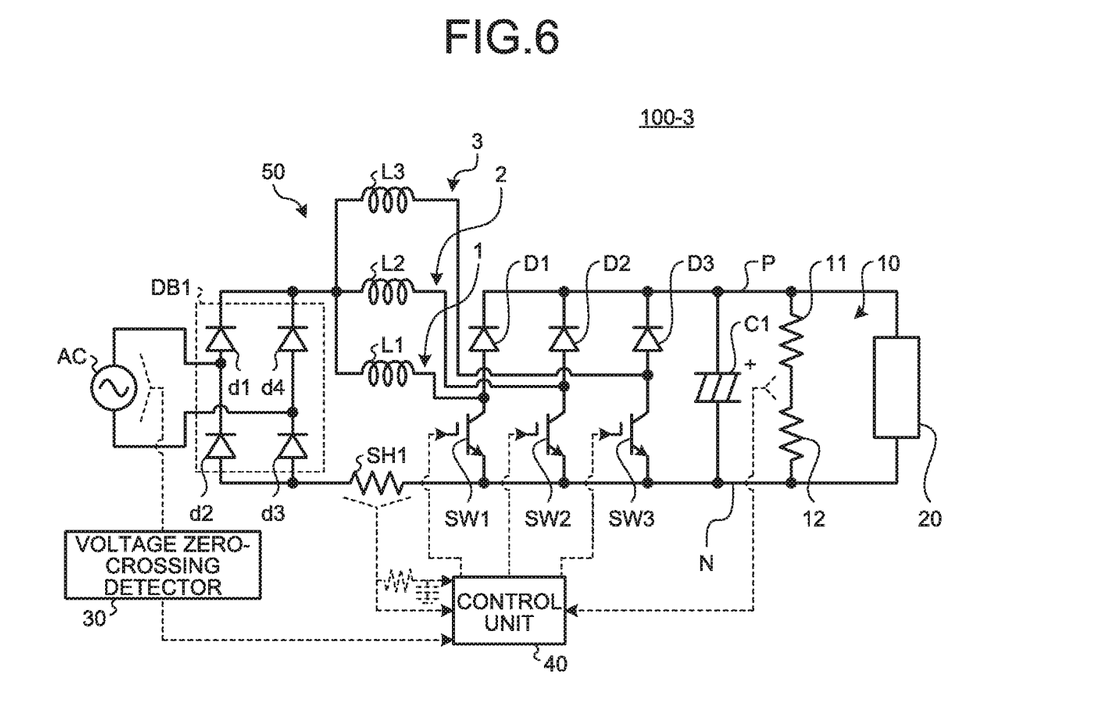
FIG. 6 is a configuration diagram of the converter device according to a third embodiment of the present invention.

FIG. 6 is a configuration diagram of the converter device according to a third embodiment of the present invention. The converter device 100 of the first embodiment and a converter device 100-3 of the third embodiment differ as below. The fault detection method is similar to the fault detection method of the second embodiment.

(1) In the interleaved power factor regulation circuit of the third embodiment, bus current information for fault detection and bus current information for power factor improvement control that are analog signals detected by the bus current detector SH1, are input to the control unit 40 through separate paths.

(2) The path for fault detection includes a filter circuit, or a low-pass filter circuit having a small time constant, which is inserted in the path for transmitting an analog signal.

(3) The path for power factor regulation control includes a low-pass filter circuit having a large time constant that is inserted in the path for transmitting an analog signal.

(4) The bus current information detected by the bus current detector SH1 is subjected to a low-pass filtering operation based on a first time constant, or alternatively is not subjected to that low-pass filtering operation, for detecting a fault of any of the booster sections 1, 2, and 3. The bus current information is subjected to a low-pass filtering operation based on a second time constant that is larger than the first time constant, for the power factor regulation control.

Figure 7:
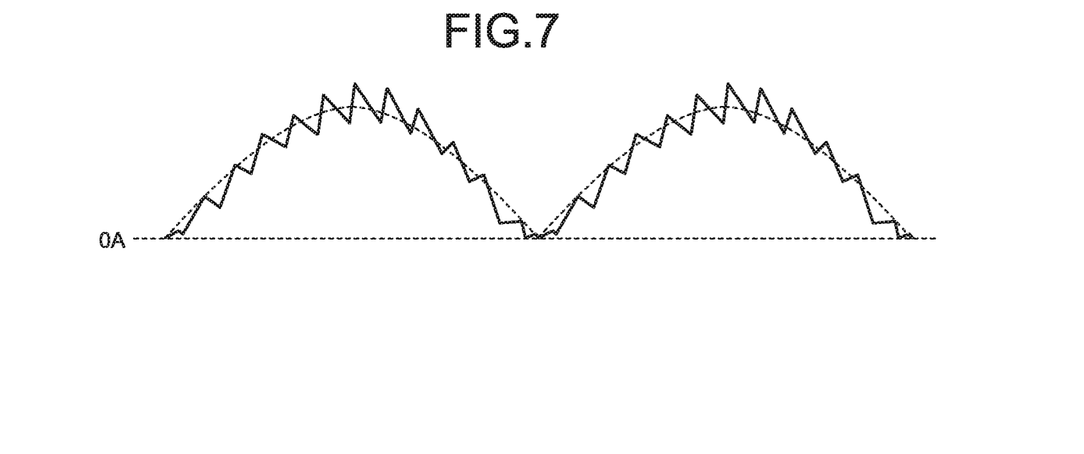
FIG. 7 is a diagram illustrating a bus current flowing to a bus current detector during power factor regulation control, and a target bus current.

A benefit of separating the bus current information path will be described below. First, the bus current flowing to the bus current detector SH1 during the power factor regulation control will be described below referring to FIG. 7. FIG. 7 is a diagram illustrating a bus current flowing to the bus current detector during the power factor regulation control, and a target bus current. In FIG. 7, the dotted line indicates the waveform of the target bus current, and this waveform is a sine curve. The solid line indicates the waveform of the bus current that actually flows to the bus current detector. The current is made to have a waveform approximated to a sine curve by repeatedly turning on and off the switching elements, and therefore, the bus current consequently has a waveform formed of a continuous set of triangular waves having an ON/OFF frequency of that switching elements. The ON and OFF frequency of the switching elements is referred to as carrier frequency.

The carrier component of the bus current is desirably removed before power factor regulation control. To this end, a low-pass filter having a large time constant is installed in the analog signal path for detecting the current for the purpose of the power factor regulation control.

In contrast, during the fault detection, a switching element is turned off after the current has been increased in a short time period, thereby making the current waveform like a triangular wave. Accordingly, a low-pass filter having a large time constant prevents the current value from being accurately detected. Thus, for the fault detection, a configuration is used such that a low-pass filter having a very small time constant is connected, or no filter is connected, in the analog signal path.

The configuration of the third embodiment can provide both fault detection and power factor regulation control with high accuracy.

Note that when the bus current information, which is an analog signal, is to be processed after being converted into a digital signal in the control unit 40, the low-pass filter may be implemented as a digital filter in the control unit 40. In this case, control may be performed without using the digital filter during the fault detection, and control may be performed using digital filter control during the power factor regulation control, thereby control can be performed without need for separating the path.

Fourth Embodiment

Figure 8:
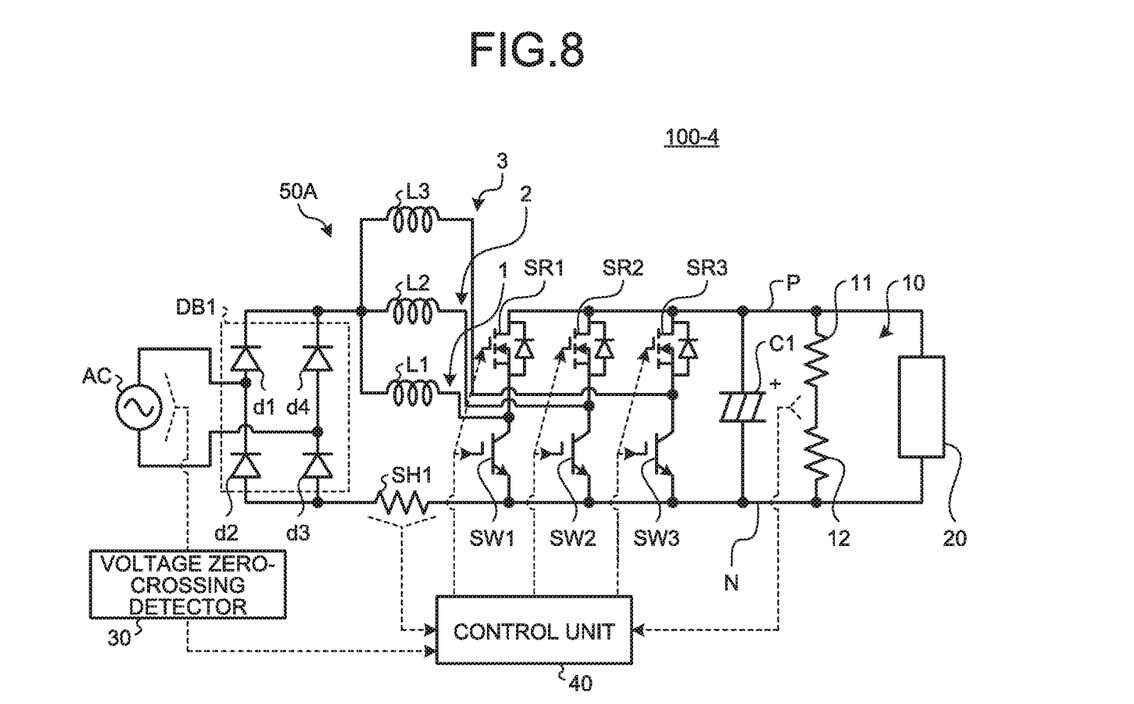
FIG. 8 is a configuration diagram of the converter device according to a fourth embodiment of the present invention.

FIG. 8 is a configuration diagram of the converter device according to a fourth embodiment of the present invention. FIG. 8 illustrates an example configuration of the booster circuit 50 in a case in which the interleaved power factor regulation circuit utilizes synchronous rectification. The converter device 100 of the first embodiment and a converter device 100-4 of the fourth embodiment differ as below.

(1) The converter device 100-4 of the fourth embodiment includes a booster circuit 50A in place of the booster circuit 50.

(2) The booster section 1 includes a transistor SR1, which is a MOSFET, in place of the reverse-blocking diode D1 of the first embodiment.

(3) The booster section 2 includes a transistor SR2, which is a MOSFET, in place of the reverse-blocking diode D2 of the first embodiment.

(4) The booster section 3 includes a transistor SR3, which is a MOSFET, in place of the reverse-blocking diode D3 of the first embodiment.

(5) The transistors SR1, SR2, and SR3 are each controlled by a gate drive signal output from the control unit 40. The transistor SR1 is maintained in the ON state while the switching element SW1 is in the OFF state, and is maintained in the OFF state while the switching element SW1 is in the ON state. The transistor SR2 is maintained in the ON state while the switching element SW2 is in the OFF state, and is maintained in the OFF state while the switching element SW2 is in the ON state. The transistor SR3 is maintained in the ON state while the switching element SW3 is in the OFF state, and is maintained in the OFF state while the switching element SW3 is in the ON state. This operation provides synchronous rectification, thereby enabling electrical loss to be reduced.

The interleave circuit utilizing synchronous rectification of the fourth embodiment can also detect a fault of any of the switching element and the reactor in each of the booster sections 1, 2, and 3 in accordance with each control of the first, second, and third embodiments. On the other hand, whether a MOSFET has a fault or not needs to be determined by another method.

Figure 9:
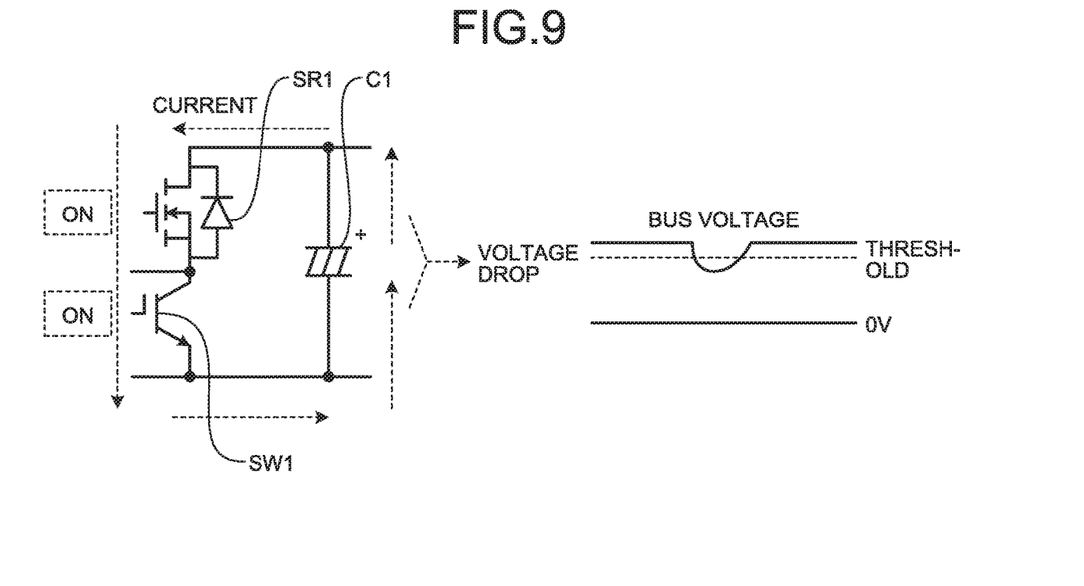
FIG. 9 is a diagram for explaining a fault detection operation for a MOSFET in the converter device according to the fourth embodiment of the present invention.

FIG. 9 is a diagram for explaining a fault detection operation for a MOSFET in the converter device according to the fourth embodiment of the present invention. FIG. 9 illustrates the transistor SR1, the switching element SW1, and the smoothing capacitor C1, all of which constitute a part of the circuit illustrated in FIG. 8. In addition, the dotted line indicates the path of the current flowing through the transistor SR1, the switching element SW1, and the smoothing capacitor C1.

For example, to detect a fault of the booster section 1, the control unit 40 turns on both of the switching element SW1 and the transistor SR1 and maintains the switching element SW1 and the transistor SR1 in the ON state for a short time period. This ON duration is set so as not to damage the element due to an overcurrent. Under this condition, a current flows along a path from the positive side of the smoothing capacitor C1 through the transistor SR1 and the switching element SW1 to the negative side of the smoothing capacitor C1 to allow an electrical charge to be discharged from the smoothing capacitor C1, and thus bus voltage across both ends of the smoothing capacitor C1 decreases.

The control unit 40 detects the bus voltage before and after the switching element SW1 and the transistor SR1 are both turned on, and determines that the transistor SR1 is in a normal condition when the difference in the bus voltage detected before and after the turning on is greater than or equal to a threshold. Otherwise, when the difference in the bus voltage detected before and after the turning on is less than the threshold, the control unit 40 determines that the path described above is not established, and thus, that the transistor SR1 is in an abnormal condition.

Similarly to the detection of a fault of the booster section 1, the control unit 40 turns on both of the switching element SW2 and the transistor SR2 to detect a fault of the transistor SR2, and turns on both of the switching element SW3 and the transistor SR3 to detect a fault of the transistor SR3. When a fault is detected, an operation is performed similarly to the first embodiment. Thus, the presence or absence of a fault of a MOSFET can be detected.

Note that when only one turn-on operation does not generate a sufficient voltage drop, thus making it hard to make a determination due to a small difference in the bus voltage between before and after both of the element SR and the element SW are turned on, the control unit 40 may perform the turn-on operation multiple times to cause a further reduction in the voltage, and thus provide control to increase the difference in the bus voltage.

Fifth Embodiment

Figure 10:
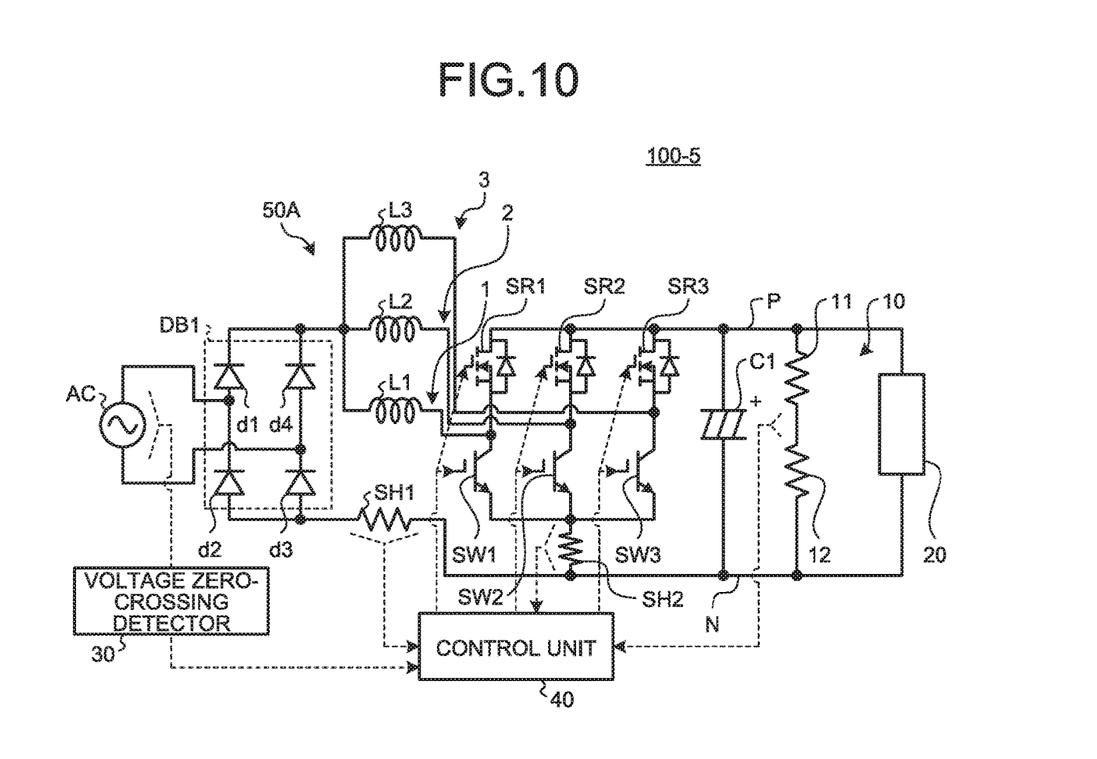
FIG. 10 is a configuration diagram of the converter device according to a fifth embodiment of the present invention.

FIG. 10 is a configuration diagram of the converter device according to a fifth embodiment of the present invention. Similarly to the fourth embodiment, a converter device 100-5 of the fifth embodiment includes an interleave circuit that utilizes synchronous rectification. The converter device 100-4 of the fourth embodiment and the converter device 100-5 of the fifth embodiment differ as below.

(1) As illustrated in FIG. 10, the converter device 100-5 includes a current detector SH2 disposed between the connection terminal of the switching elements SW1, SW2, and SW3 and the negative-side DC bus N.

(2) The current detector SH2 detects the total amount of the currents flowing through the switching elements SW1, SW2, and SW3 respectively in the multiple booster sections 1, 2, and 3.

(3) The control unit 40 detects a fault of any of the transistors SR1, SR2, and SR3 using the value of the current detected by the current detector SH2.

For example, when, in the booster section 1, both of the switching element SW1 and the transistor SR1 are turned on, and the magnitude of the current detected by the current detector SH2 is greater than or equal to a threshold, the control unit 40 determines that the transistor SR1 is in a normal condition, while when the magnitude of the current detected by the current detector SH2 is less than the threshold, the control unit 40 determines that the transistor SR1 is in an abnormal condition. Determinations on the booster section 2 and on the booster section 3 are performed similarly. Thus, the presence or absence of faults of the transistors SR1, SR2, and SR3 can be detected.

Note that, because the current detector SH2 is a current detector merely for a protection function, the current detector SH2 may have an accuracy lower than the accuracy of the bus current detector SH1, thereby enabling the cost to be reduced.

In addition, the control unit 40 of the first through fifth embodiments may be configured such that, upon detection of a fault in at least one booster section of the multiple booster sections 1, 2, and 3, the control unit 40 inhibits power factor regulation control and an increase of the load of the load 20. This operation can prevent a current higher than a predicted level from flowing to a circuit element, and can thus prevent an overheat fault from occurring.

Moreover, the control unit 40 of the first through fifth embodiments may be configured to, when n booster sections are detected as having a fault among parallel-coupled m multiple booster sections 1, 2, ... m, permit the power factor improvement operation, but limit the increase of the load to $(m-n)/m$ times the rated value of the load. Here, m and n are each an integer greater than or equal to 1, and satisfy $n \leq m$.

This operation can prevent a current higher than a predicted level from flowing to a circuit element, and can thus prevent an overheat fault from occurring.

The configurations described in the foregoing embodiments are merely examples of various aspects of the present invention. These configurations may be combined with a known other technology, and moreover, a part of such configurations may be omitted and/or modified without departing from the spirit of the present invention.

The invention claimed is:

1. A converter device for converting alternating current power supplied from an alternating current power supply into direct current power, and outputting the direct current power to a load, the converter device comprising:
   a rectification circuit to receive the alternating current power from the alternating current power supply as an input, and to perform full-wave rectification on the alternating current power received;
   a booster circuit to boost an output voltage from the rectification circuit;
   a smoothing capacitor to smooth an output voltage from the booster circuit, and to output the voltage smoothed, to the load; and
   a controller to control the booster circuit, wherein
   the booster circuit includes a plurality of booster sections each of which includes a reactor, a switching element, and a reverse-blocking diode, and
   the controller compares a detected value of bus current that flows while the switching element in the at least one of the plurality of booster sections is maintained in an "on" state for the predetermined time period, with a fault determination threshold to determine the presence or absence of a fault of the booster section.

2. A converter device for converting alternating current power supplied from an alternating current power supply into direct current power, and outputting the direct current power to a load, the converter device comprising:
   a rectification circuit to receive the alternating current power from the alternating current power supply as an input, and to perform full-wave rectification on the alternating current power received;
   a booster circuit to boost an output voltage from the rectification circuit;
   a smoothing capacitor to smooth an output voltage from the booster circuit, and to output the voltage smoothed, to the load;
   a controller to control the booster circuit, and
   a phase detection section to detect a phase of a voltage applied by the alternating current power supply, wherein
   the booster circuit includes a plurality of booster sections each of which includes a reactor, a switching element, and a reverse-blocking diode, and
   the controller turns on the switching element when the phase of the voltage applied by the alternating current power supply reaches a predetermined value to determine the presence or absence of a fault of the booster section.

3. A converter device for converting alternating current power supplied from an alternating current power supply into direct current power, and outputting the direct current power to a load, the converter device comprising:
   a rectification circuit to receive the alternating current power from the alternating current power supply as an input, and to perform full-wave rectification on the alternating current power received;
   a booster circuit to boost an output voltage from the rectification circuit;
   a smoothing capacitor to smooth an output voltage from the booster circuit, and to output the voltage smoothed, to the load;
   a controller to control the booster circuit, and
   a supply voltage detector to detect an instantaneous value of a voltage applied by the alternating current power supply, wherein
   the booster circuit includes a plurality of booster sections each of which includes a reactor, a switching element, and a reverse-blocking diode, and
   the controller turns on the switching element when the instantaneous value of the voltage applied by the alternating current power supply reaches a predetermined value to determine the presence or absence of a fault of the booster section.

4. A converter device for converting alternating current power supplied from an alternating current power supply into direct current power, and outputting the direct current power to a load, the converter device comprising:
   a rectification circuit to receive the alternating current power from the alternating current power supply as an input, and to perform full-wave rectification on the alternating current power received;
   a booster circuit to boost an output voltage from the rectification circuit;
   a smoothing capacitor to smooth an output voltage from the booster circuit, and to output the voltage smoothed, to the load;
   a controller to control the booster circuit, and
   a bus current detector to detect a current flowing to the rectification circuit, wherein
   the booster circuit includes a plurality of booster sections each of which includes a reactor, a switching element, and a reverse-blocking diode, and
   the controller maintains, in an "on" state, the switching element included in at least one of the plurality of booster sections for a predetermined time period to determine presence or absence of a fault of the at least one of the booster sections, and performs, on bus current information detected by the bus current detector, a low-pass filtering operation based on a first time constant, or no low-pass filtering operation based on the first time constant, for detecting a fault of the booster section, and a low-pass filtering operation based on a second time constant larger than the first time constant, for power factor regulation control.

5. The converter device according to claim 1, wherein
   a MOSFET that is a metal oxide semiconductor field effect transistor is used in place of the reverse-blocking diode, and
   the controller performs synchronous rectification in which the MOSFET is maintained in an "off" state during a time period in which the switching element is in an "on" state, and the MOSFET is maintained in an "on" state during a time period in which the switching element is in an "off" state.

6. A converter device for converting alternating current power supplied from an alternating current power supply into direct current power, and outputting the direct current power to a load, the converter device comprising:
   a rectification circuit to receive the alternating current power from the alternating current power supply as an input, and to perform full-wave rectification on the alternating current power received;

a booster circuit to boost an output voltage from the rectification circuit;
a smoothing capacitor to smooth an output voltage from the booster circuit, and to output the voltage smoothed, to the load;
a controller to control the booster circuit, and wherein
the converter device includes a bus voltage detection circuit to detect a voltage applied to the smoothing capacitor,
the booster circuit includes a plurality of booster sections each of which includes a reactor, a switching element, and a MOSFET that is a metal oxide semiconductor field effect transistor, and
the controller turns on both of the switching element in the at least one of the plurality of booster sections and the MOSFET, and compares the bus voltages detected by the bus voltage detection circuit before and after the turning on to determine the presence or absence of a fault of the at least one of the booster sections.

7. A converter device for converting alternating current power supplied from an alternating current power supply into direct current power, and outputting the direct current power to a load, the converter device comprising:
a rectification circuit to receive the alternating current power from the alternating current power supply as an input, and to perform full-wave rectification on the alternating current power received;
a booster circuit to boost an output voltage from the rectification circuit;
a smoothing capacitor to smooth an output voltage from the booster circuit, and to output the voltage smoothed, to the load;
a controller to control the booster circuit, and wherein
the booster circuit includes a plurality of booster sections each of which includes a reactor, a switching element, and a MOSFET that is a metal oxide semiconductor field effect transistor, and
the controller turns on both of the switching element in the at least one of the plurality of booster sections and the MOSFET, and compares the amount of current detected by a current detector that detects a total amount of currents flowing through the switching elements in the plurality of booster sections during the "on" state with a fault determination threshold to determine the presence or absence of a fault of the at least one of the booster sections.

8. The converter device according to claim 1, wherein when the at least one booster section of the plurality of booster sections is detected as having a fault, the controller inhibits power factor regulation control and an increase in a load of the load.

9. The converter device according to claim 1, wherein when n booster sections are detected as having a fault among parallel-coupled m booster sections of the plurality of booster sections, a power factor improvement operation is permitted, but an increase in a load of the load is limited to (m−n)/m times a rated value of the load, wherein m and n are each an integer greater than or equal to 1, and satisfy n≤m.

10. The converter device according to claim 1, wherein the load is an air conditioner.

11. The converter device according to claim 2, wherein
a MOSFET that is a metal oxide semiconductor field effect transistor is used in place of the reverse-blocking diode, and
the controller performs synchronous rectification in which the MOSFET is maintained in an "off" state during a time period in which the switching element is in an "on" state, and the MOSFET is maintained in an "on" state during a time period in which the switching element is in an "off" state.

12. The converter device according to claim 3, wherein
a MOSFET that is a metal oxide semiconductor field effect transistor is used in place of the reverse-blocking diode, and
the controller performs synchronous rectification in which the MOSFET is maintained in an "off" state during a time period in which the switching element is in an "on" state, and the MOSFET is maintained in an "on" state during a time period in which the switching element is in an "off" state.

13. The converter device according to claim 4, wherein
a MOSFET that is a metal oxide semiconductor field effect transistor is used in place of the reverse-blocking diode, and
the controller performs synchronous rectification in which the MOSFET is maintained in an "off" state during a time period in which the switching element is in an "on" state, and the MOSFET is maintained in an "on" state during a time period in which the switching element is in an "off" state.

14. The converter device according to claim 2, wherein when the at least one booster section of the plurality of booster sections is detected as having a fault, the controller inhibits power factor regulation control and an increase in a load of the load.

15. The converter device according to claim 3, wherein when the at least one booster section of the plurality of booster sections is detected as having a fault, the controller inhibits power factor regulation control and an increase in a load of the load.

16. The converter device according to claim 4, wherein when the at least one booster section of the plurality of booster sections is detected as having a fault, the controller inhibits power factor regulation control and an increase in a load of the load.

17. The converter device according to claim 6, wherein when the at least one booster section of the plurality of booster sections is detected as having a fault, the controller inhibits power factor regulation control and an increase in a load of the load.

18. The converter device according to claim 7, wherein when the at least one booster section of the plurality of booster sections is detected as having a fault, the controller inhibits power factor regulation control and an increase in a load of the load.

19. The converter device according to claim 2, wherein when n booster sections are detected as having a fault among parallel-coupled m booster sections of the plurality of booster sections, a power factor improvement operation is permitted, but an increase in a load of the load is limited to (m−n)/m times a rated value of the load, wherein m and n are each an integer greater than or equal to 1, and satisfy n≤m.

20. The converter device according to claim 3, wherein when n booster sections are detected as having a fault among parallel-coupled m booster sections of the plurality of booster sections, a power factor improvement operation is permitted, but an increase in a load of the load is limited to (m−n)/m times a rated value of the load, wherein m and n are each an integer greater than or equal to 1, and satisfy n≤m.

21. The converter device according to claim 4, wherein when n booster sections are detected as having a fault among parallel-coupled m booster sections of the plurality of booster sections, a power factor improvement operation is permitted, but an increase in a load of the load is limited to (m−n)/m times a rated value of the load, wherein m and n are each an integer greater than or equal to 1, and satisfy n≤m.

22. The converter device according to claim 6, wherein when n booster sections are detected as having a fault among parallel-coupled m booster sections of the plurality of booster sections, a power factor improvement operation is permitted, but an increase in a load of the load is limited to (m−n)/m times a rated value of the load, wherein m and n are each an integer greater than or equal to 1, and satisfy n≤m.

23. The converter device according to claim 7, wherein when n booster sections are detected as having a fault among parallel-coupled m booster sections of the plurality of booster sections, a power factor improvement operation is permitted, but an increase in a load of the load is limited to (m−n)/m times a rated value of the load, wherein m and n are each an integer greater than or equal to 1, and satisfy n≤m.

24. The converter device according to claim 2, wherein the load is an air conditioner.

25. The converter device according to claim 3, wherein the load is an air conditioner.

26. The converter device according to claim 4, wherein the load is an air conditioner.

27. The converter device according to claim 6, wherein the load is an air conditioner.

28. The converter device according to claim 7, wherein the load is an air conditioner.

* * * * *